(12) United States Patent
Yuan et al.

(10) Patent No.: US 7,724,016 B2
(45) Date of Patent: May 25, 2010

(54) CHARACTERIZING CIRCUIT PERFORMANCE BY SEPARATING DEVICE AND INTERCONNECT IMPACT ON SIGNAL DELAY

(75) Inventors: Xiao-Jie Yuan, Sunnyvale, CA (US);
Michael J. Hart, Palo Alto, CA (US);
Zicheng G. Ling, San Jose, CA (US);
Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/355,988

(22) Filed: Jan. 19, 2009

(65) Prior Publication Data
US 2009/0121737 A1 May 14, 2009

Related U.S. Application Data

(62) Division of application No. 11/498,371, filed on Aug. 3, 2006, now Pat. No. 7,489,152, which is a division of application No. 10/742,300, filed on Dec. 18, 2003, now Pat. No. 7,109,734.

(51) Int. Cl.
*G01R 31/02* (2006.01)
(52) U.S. Cl. ..................................... 324/763
(58) Field of Classification Search .................. None
See application file for complete search history.

(56) References Cited

U.S. PATENT DOCUMENTS

| 4,870,346 A | 9/1989 | Mydill et al. |
|---|---|---|
| 4,937,770 A | 6/1990 | Samuels et al. |
| 5,150,044 A | 9/1992 | Hashizume et al. |
| 5,347,519 A | 9/1994 | Cooke et al. |
| 5,550,843 A | 8/1996 | Yee |
| 5,574,853 A | 11/1996 | Barch et al. |
| 5,623,502 A | 4/1997 | Wang |
| 5,648,973 A | 7/1997 | Mote |
| 5,790,479 A | 8/1998 | Conn |
| 5,937,179 A | 8/1999 | Swoboda |
| 5,963,043 A | 10/1999 | Nassif et al. |
| 5,968,196 A | 10/1999 | Ramamurthy et al. |

(Continued)

OTHER PUBLICATIONS

U.S. Appl. No. 11/498,371, filed Aug. 3, 2006, Yuan et al.

(Continued)

*Primary Examiner*—Jermele M Hollington
(74) *Attorney, Agent, or Firm*—Eric Hoffman

(57) ABSTRACT

An integrated circuit (IC) includes multiple embedded test circuits that all include a ring oscillator coupled to a test load. The test load either is a direct short in the ring oscillator or else is a interconnect load that is representative of one of the interconnect layers in the IC. A model equation is defined for each embedded test circuit, with each model equation specifying the output delay of its associated embedded test circuit as a function of Front End OF the Line (FEOL) and Back End Of the Line (BEOL) parameters. The model equations are then solved for the various FEOL and BEOL parameters as functions of the test circuit output delays. Finally, measured output delay values are substituted in to these parameter equations to generate actual values for the various FEOL and BEOL parameters, thereby allowing any areas of concern to be quickly and accurately identified.

9 Claims, 7 Drawing Sheets

U.S. PATENT DOCUMENTS

| | | | |
|---|---|---|---|
| 5,991,898 | A | 11/1999 | Rajski et al. |
| 6,005,829 | A | 12/1999 | Conn et al. |
| 6,006,347 | A | 12/1999 | Churchill et al. |
| 6,219,305 | B1 | 4/2001 | Patrie et al. |
| 6,507,942 | B1 | 1/2003 | Calderone et al. |
| 6,553,545 | B1 | 4/2003 | Stinson et al. |
| 6,657,504 | B1 | 12/2003 | Deal et al. |
| 6,724,214 | B2 | 4/2004 | Manna et al. |
| 6,759,863 | B2 | 7/2004 | Moore |
| 6,785,627 | B2 | 8/2004 | Corr |
| 6,792,374 | B2 | 9/2004 | Corr |
| 6,882,172 | B1 | 4/2005 | Suzuki et al. |
| 6,903,564 | B1 | 6/2005 | Suzuki |
| 7,109,734 | B2 | 9/2006 | Yuan et al. |
| 7,489,152 | B2 * | 2/2009 | Yuan et al. ............... 324/763 |
| 7,619,486 | B1 * | 11/2009 | Lesea ..................... 331/176 |
| 2005/0057315 | A1 * | 3/2005 | Groen et al. ............... 331/57 |

OTHER PUBLICATIONS

Ooman, Bejoy G. et al., "A Universal Technique for Accelerating Simulation of Scan Test Patterns," *Proc. of the IEEE International Test Conference on Test and Design Validity (ITC'96)*, Oct. 20-25, 1996, pp. 135-141, Washington, DC, USA.

Gonzalez-Valentin, Karen M., "Extraction of Variation Sources Due to Layout Practices," May 24, 2002, pp. 1-107, available from the Massachusetts Institute of Technology, Department of Electrical Engineering and Computer Science, 77 Massachusetts Avenue, Cambridge, MA 02139.

* cited by examiner

RAW FEOL DATA

FEOL DATA AFTER BEOL EXTRACTION

RAW BEOL DATA

BEOL DATA AFTER FEOL EXTRACTION

CHARACTERIZING CIRCUIT PERFORMANCE BY SEPARATING DEVICE AND INTERCONNECT IMPACT ON SIGNAL DELAY

This application is a Divisional of Ser. No. 11/498,371 filed on Aug. 3, 2006 now U.S. Pat. No. 7,489,152 which is a Divisional of Ser. No. 10/742,300 filed on Dec. 18, 2003 now U.S. Pat. No. 7,109,734.

FIELD OF THE INVENTION

The invention relates to the field of integrated circuit testing, and in particular to a system and method for determining the signal delay contributions from specific process layers.

BACKGROUND OF THE INVENTION

The performance of an integrated circuit (IC) is largely determined by its timing characteristics (i.e., the speed at which signals propagate through the IC). This signal propagation speed is typically analyzed via standalone testing systems that interface with dedicated test structures formed on the IC chip. Note that the term "IC chip" refers to the combination of the IC (i.e., the circuit structures and devices that provide the desired functionality, such as a field programmable gate array (FPGA) or an complex programmable logic device (CPLD)) and the die, or substrate, on which the IC is formed. Because a large number of IC chips are manufactured simultaneously on a single wafer, the die area is larger than the IC area, to allow for scribe line regions between ICs. The scribe line regions allow the wafer to be sawn apart into individual IC chips without risk of damage to the ICs.

The scribe line regions also provide locations for the dedicated test structures used in conventional IC test techniques. For example, FIG. 1 shows a conventional IC chip 100 that includes an FPGA 110 formed on a die 120. FPGA 110 includes multiple configurable logic blocks (CLBs) 111, multiple input/output blocks (IOBs) 112, and a programmable interconnect matrix 113 that routes signals between the CLBs and IOBs. CLBs 111, IOBs 112, and interconnect matrix 113 are programmable by a user to provide a desired functionality for IC chip 100.

IC chip 100 also includes a scribe line test circuit 131 and a test pad 132 formed in a scribe line region 121 of die 120. Scribe line test circuit 131 is typically a ring oscillator (series of inverters) coupled to a load that is intended to be representative of the electrical behavior of FPGA 110. The output frequency of the ring oscillator is measured at test pad 132, and this frequency is used to derive a signal propagation speed value. A substantial difference between this derived signal propagation speed and the expected signal propagation speed for FPGA 110 can indicate a design or manufacturing problem associated with IC chip 100.

Unfortunately, this "external" measurement technique can be less than ideal in many circumstances. First, because scribe line test circuit 131 is external to FPGA 110, the devices and structures within circuit 131 may not accurately match the devices and structures within FPGA 110. The environment within FPGA 110 (e.g., thermal and electrical conditions) can be very different from the isolated environment in which scribe line test circuit 131 is located. Therefore, dimensional similarity between the circuit 131 and FPGA 110 may not be enough to provide performance similarity.

Also, because the frequency measurement must be taken by an external measurement system (via test pad 132), the technique can be very time consuming. This makes it infeasible to test all the ICs on a wafer (conventional testing systems typically only inspect about five dies per wafer), and so localized manufacturing problems may not be detected.

In addition, the electrical connection that must be made between the test probe of the external measurement system and test pad 132 introduces various parasitic effects into the measurement. Furthermore, the external measurement system will typically have an operating frequency below 1 MHz, and therefore forces scribe line test circuit 131 to operate at a frequency far below the normal operating range of FPGA 110 (which can have an operating frequency in the 200-300 MHz range). These measurement inaccuracies can significantly skew the final measurement results.

However, perhaps the most significant limitation associated with this conventional measurement technique is that it only provides a "bulk" reading of IC performance, and there is no way to determine the actual source of any unexpected signal propagation delays. This is problematic, since any subsequent troubleshooting of IC performance degradation must therefore involve a comprehensive, and hence inefficient, methodology that examines all the different IC components.

Accordingly, it is desirable to provide a method and structure for efficiently analyzing the performance of an IC and determining the source of any unexpected performance degradation.

SUMMARY OF THE INVENTION

By embedding component-specific test circuitry within an IC, the invention enables efficient identification of problematic components within the IC. According to an embodiment of the invention, an IC includes multiple embedded test circuits, with each embedded test circuit including a ring oscillator coupled to a test load. The test load is either a direct short in the ring oscillator chain, or else is an interconnect structure that simulates one of the interconnect layers within the IC, such as a metal meander line or a contact/via chain.

The ring oscillator generates a periodic signal that has a frequency proportional to the delays introduced by the components making up the ring oscillator. By coupling a test load to the ring oscillator, the periodic signal frequency is further reduced by an additional delay that represents the delay effects of the interconnect layer associated with the test load. Therefore, by creating different test loads associated with different interconnect layers, the embedded test circuits provide a set of output signals that can be used to identify performance-affecting problems in the different interconnect layers.

According to an embodiment of the invention, the IC can be a programmable device, such as a field programmable gate array (FPGA), in which case the IC itself can be configured to collect the actual measurements of output delays from the embedded test circuits. By performing this type of "on-chip" measurement, the interface, speed, and accuracy limitations associated with conventional external measurement systems can be avoided.

According to an embodiment of the invention, the embedded test circuit outputs can be processed by creating a model equation for each embedded test circuit. The model equation for a particular embedded test circuit specifies the output delay for that test circuit as a function of at least one parameter associated with the devices making up the ring oscillator (typically transistor speed) and at least one parameter associated with one or more interconnect layers in the IC (such as interconnect capacitance or resistance).

Then, by solving the model equations for the device-related parameter(s) and the interconnect-related parameter(s), a set of parameter equations can be generated that are functions of the output delays of the embedded test circuits. Output delay measurements taken from the embedded test circuits can then be plugged in to the parameter equations to determine values for the device- and interconnect-related parameters. By comparing these calculated values to expected parameter values, any process- or design-related problems can be readily identified.

The invention will be more fully understood in view of the following description of the exemplary embodiments and the drawings thereof.

DETAILED DESCRIPTION

By creating a set of embedded test structures within an IC, the invention allows the performance of the IC to be determined by solving a simple set of linear equations. By analyzing the measurements from the different embedded test structures, the source(s) of any performance degradation can be isolated and identified. Furthermore, by embedding the test structures within the IC (rather than forming them in the scribe line region of the die), the measurement problems associated with external measurement systems (described above) can be avoided.

Figure 1:
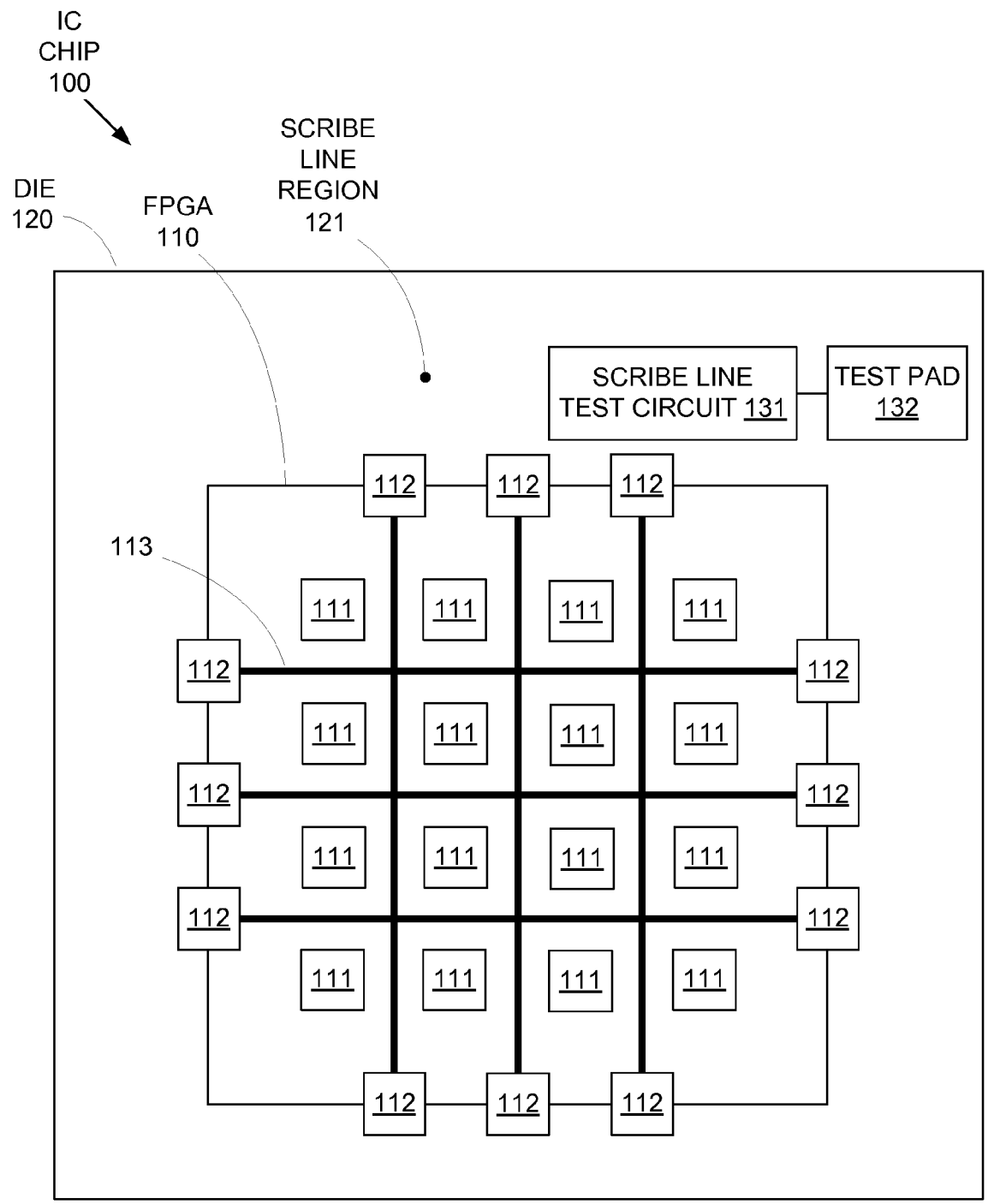
FIG. 1 is a schematic diagram of an IC including conventional scribe line test circuits.
Figure 2:
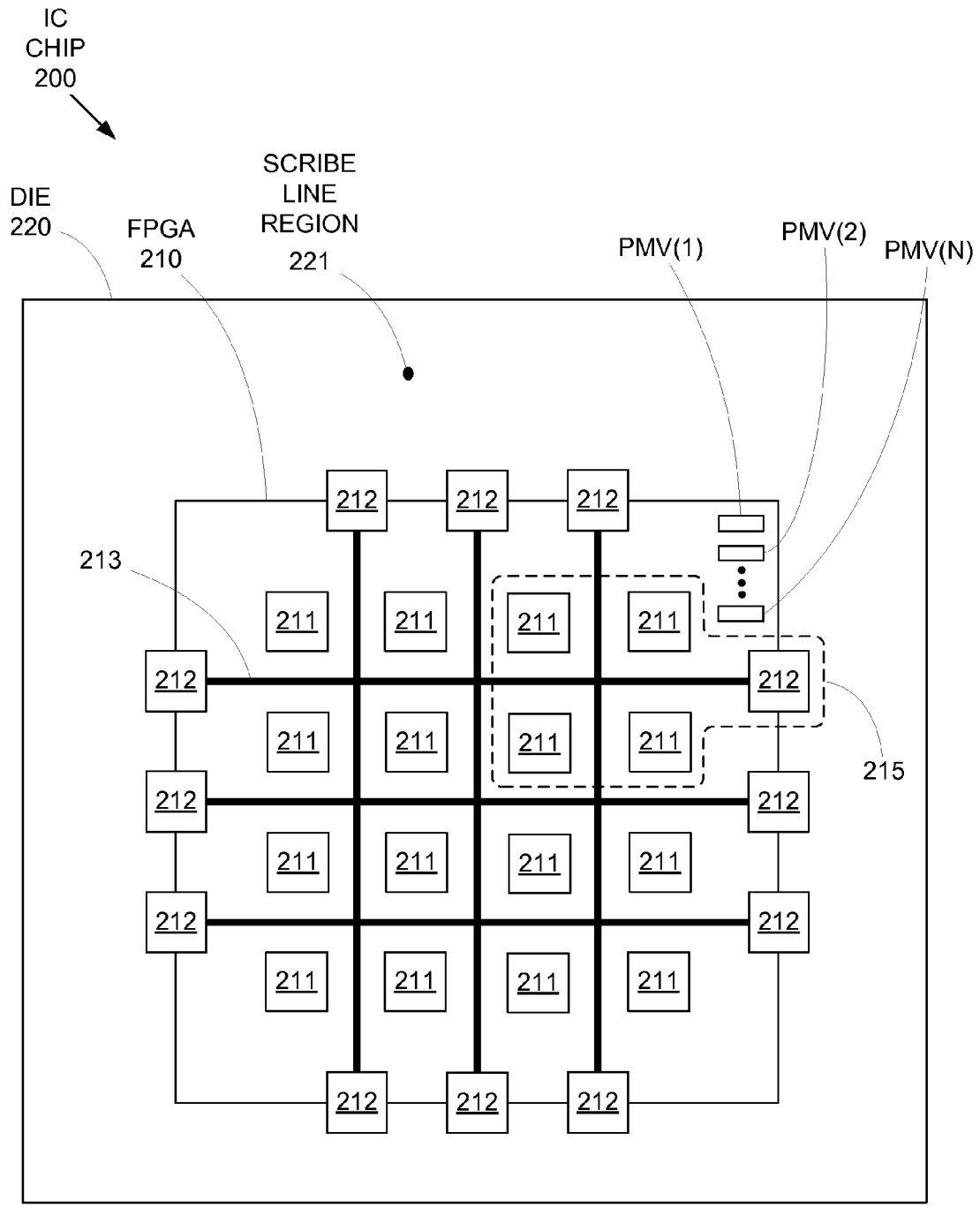
FIG. 2 is a schematic diagram of an IC including embedded test circuits, according to an embodiment of the invention.

FIG. 2 shows a diagram of an IC chip 200 that includes an FPGA 210 formed on a die 220. Note that while IC chip 200 includes an FPGA for exemplary purposes, the invention can be used with any type of integrated circuit. For example, FPGA 210 could be replaced with a CPLD or other type of programmable logic IC. Note further that while some benefits of the invention (such as on-board measurement, described in greater detail below) are realized through the configurable nature of programmable logic ICs, other benefits of the invention (such as improved analytical capabilities, described in greater detail below) accrue to even non-programmable ICs.

FPGA 210 includes a plurality of configurable logic blocks (CLBs) 211, a plurality of input/output blocks (IOBs) 212, a programmable interconnect matrix 213, and embedded test circuits (performance monitor vehicle) PMV(1), PMV(2), . . . , and PMV(N). CLBs 211, IOBs 212, and programmable interconnect matrix 213 can be configured to provide a desired functionality for IC chip 200. Embedded test circuits PMV(1)-PMV(N) generate output signals that are representative of the various component types (e.g., core transistors, I/O transistors, the interconnects in different metal layers) that form FPGA 210.

The output of each of embedded test circuits PMV(1)-PMV(N) is an "output delay" value that is proportional to the frequency of a periodic signal that is generated within the embedded test circuit (note that the actual output signal will typically be the periodic signal itself). This output delay is therefore indicative of the performance characteristics of the component types associated with that particular embedded test circuit.

According to another embodiment of the invention, embedded test circuits PMV(1)-PMV(N) are addressable via programmable interconnect matrix 213. For example, a set of CLBs 211 and one or more IOBs 212 can be configured as a frequency measurement circuit 215 (indicated by the dashed line) for reading the outputs of embedded test circuits PMV (1)-PMV(N). By implementing the actual measurement capability within the FPGA itself, many of the limitations associated with conventional external measurement systems can be eliminated. For example, because measurement circuit 215, operate at the speed of the FPGA, embedded test circuits PMV(1)-PMV(N) can also operate at that high speed, thereby allowing for more accurate detection of small capacitance variations.

Figure 3:
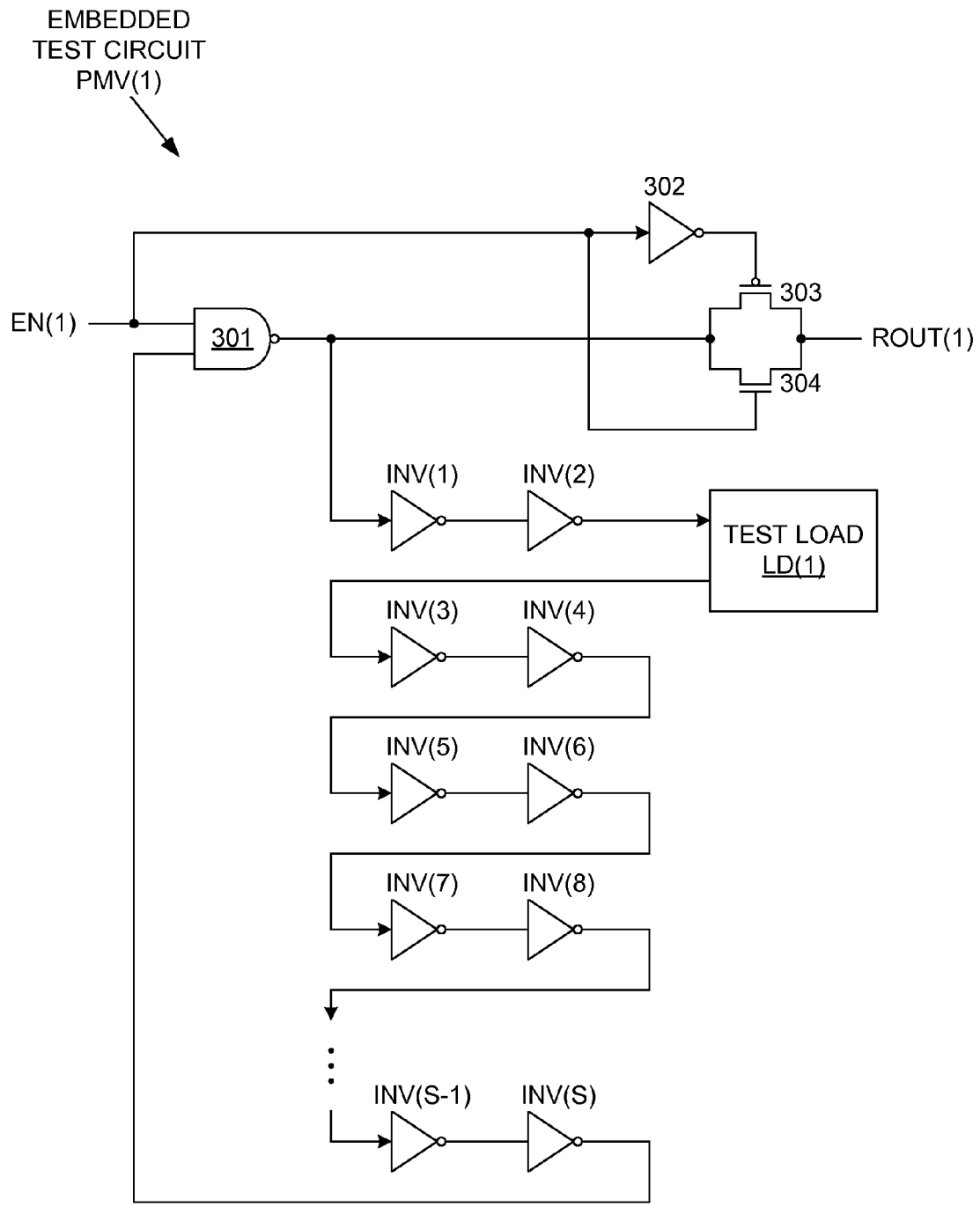
FIG. 3 is a schematic diagram of an embedded test circuit, according to an embodiment of the invention.

According to an embodiment of the invention, each of embedded test circuits PMV(1)-PMV(N) includes a ring oscillator coupled to a test load. For example, FIG. 3 shows an exemplary schematic diagram of embedded test circuit PMV (1), according to an embodiment of the invention. Embedded test circuit PMV(1) includes inverters INV(1)-INV(S), a test load LD(1), a NAND gate 301, an inverter 302, a PMOS transistor 303, and an NMOS transistor 304. Inverters INV (1)-INV(S) and test load LD(1) are serially connected between the output and a first input of NAND gate 301. Transistors 303 and 304 are configured as a pass gate at the output of NAND gate 301. An enable signal EN(1) is provided to a second input of NAND gate 301 and the gate of NMOS transistor 304. Inverter 302 inverts enable signal EN(1) and provides the inverted output to the gate of PMOS transistor 303.

When enable signal EN(1) is asserted HIGH, the pass gate formed by transistors 303 and 304 is turned on, and the output of NAND gate 301 is provided as an output signal ROUT(1). Meanwhile, the logic HIGH enable signal EN(1) at the second input of NAND gate 301 causes NAND gate 301 to operate as an inverter with respect to the signal provided to its first input (from inverter INV(S)). When configured as an inverter in this manner, NAND gate 301 and (the even number of) inverters INV(1)-INV(S) form a ring oscillator. The output of the ring oscillator can then be read as output ROUT(1).

The frequency of output ROUT(1) is dependent on the delays generated by inverters INV(1)-INV(S) (and NAND gate 301) and test load LD(1). The inverter delays are mainly related to the speed of the transistors making up those inverters, and therefore correspond to FEOL (Front End Of the Line) delays in FPGA 210 (shown in FIG. 2). FEOL components are generally transistors, which are formed directly in or on the semiconductor substrate during the early stages of the manufacturing process. For example, the high-power input/output (I/O) transistors in IOBs 212 are one type of FEOL component. The high-speed core transistors in CLBs 211 are another type of FEOL component. Various other types of FEOL components will be readily apparent.

Transistor speed (i.e., the speed at which signals are transferred between the data terminals of a transistor) is the main source of FEOL delay, and is governed by transistor physical characteristics (e.g., gate length, gate oxide thickness). For example, an I/O transistor, which has a relatively thick gate oxide to provide robust handling of high power signals, will have a lower transistor speed than a core transistor, which has a relatively thin gate oxide and is specifically designed for high speed operation.

To prevent performance differences between different types of transistors from complicating the analysis, the ring oscillator in each embedded test circuit PMV(1)-PMV(N) can be formed using a single type of transistor. For example, inverters INV(1)-INV(S) and NAND gate 301 in embedded test structure PMV(1) shown in FIG. 3 could all be made up of I/O transistors (i.e., transistors formed during the same process steps and following the same design rules as the I/O transistors in IOBs 212 of FPGA 210). A different embedded test structure PMV(2) might include only high speed core transistors. In this manner, the output of any particular embedded test circuit is related to a single type of FEOL component.

Meanwhile, test load LD(1) is either a direct short (i.e., a low-resistance, physically short electrical connection) between the output of inverter INV(2) and the input of inverter INV(3), or else is an interconnect simulation structure that is formed in one of the metal or via layers of FPGA 210. When test load LD(1) is a direct short, embedded test circuit PMV(1) is classified as an "unloaded" test circuit, since no additional delay is added by test load LD(1). Thus, the output delay of the ring oscillator is driven solely by the ring oscillator itself. However, when test load LD(1) is an interconnect simulation structure, embedded test circuit PMV(1) is classified as a "loaded" test circuit, since test load LD(1) adds a substantial BEOL delay element into output signal ROUT(1), and so the ring oscillator output delay is driven by both the ring oscillator structures (inverters) and test load LD(1).

BEOL (Back End Of the Line) components mainly include the interconnect structures formed during the latter stages of IC production. The complex routing requirements of modern ICs can lead to long and densely packed layers of metal wires that significantly affect the IC performance. Test load LD(1) can mimic this BEOL delay by incorporating a wire routing path between the output of inverter INV(2) and the input of INV(3) that physically resembles a typical or average interconnect path in FPGA 210.

BEOL components are defined by the particular process layer in which they are formed. For example, the interconnects formed in the metal-1 layer (M1 interconnects) represent a first type of BEOL component, while the interconnects formed in the metal-2 layer (M2 interconnects) represent a second type of BEOL component. In a similar manner, the plugs (vertical interconnects) formed through the via-1 layer between the M1 and M2 layers (V1 interconnects) represent a third type of BEOL component. Thus, the total number of BEOL component types will depend on the total number of interconnect layers used to produce a particular IC.

For example, many modern ICs, such as FPGAs, include nine metal layers and eight via layers (i.e., seventeen total interconnect layers). However, components formed in upper metal layers generally include much thicker/wider geometries than those formed in lower metal layers. Therefore, the signal delay contributions from interconnect layers are mainly determined by the lower metal layers of an IC (e.g., metal layers M1, M2, M3, and M4, and via layers V1, V2, and V3). According to an embodiment of the invention, only these seven lower of interconnect layers are included as BEOL components in the IC performance characterization.

According to an embodiment of the invention, embedded test circuit PMV(1) can include a test load LD(1) that corresponds to a single type of BEOL component—i.e., a test load LD(1) that provides a delay contribution that is mainly due to that single type of BEOL component. For example, to create a correspondence to M1 interconnects, test load LD(1) could be formed in metal layer M1. The more closely the configuration (i.e., the size, spacing, orientation) and layout of test load LD(1) in metal layer M1 matches the layout of actual M1 interconnects, the more accurately test load LD(1) represents those M1 interconnects.

Note that some of this matching occurs simply due to the fact that the bulk of test load LD(1) is formed in the appropriate interconnect layer (e.g., layer M1). However, according to various embodiments of the invention, test load LD(1) can include an interconnect layout that simulates an "average" M1 interconnect layout (i.e., an interconnect layout that resembles a typical routing path within metal layer M1) or a "worst case" M1 interconnect layer (i.e., an interconnect layout that mimics the most problematic routing portion(s) within metal layer M1). Test load LD(1) can even include an exact duplicate of an M1 interconnect path from the functional portion of the IC.

Note that the output of each embedded test circuit PMV (1)-PMV(N) shown in FIG. 2 will include both FEOL and BEOL delay contributions, regardless of whether the test circuit is unloaded or loaded. For example, while the output delay from an unloaded test circuit will be primarily driven by the (FEOL) transistors making up the ring oscillator, the (BEOL) interconnects that connect all those transistors will also have some effect. Meanwhile, a loaded test circuit will include the same FEOL delay effect from its ring oscillator transistor, but will also include a much larger (BEOL) interconnect delay effect due to the metal or via layer simulation structure in the test load.

Thus, while a rough idea of the relative delay contributions from FEOL and BEOL components can be determined by simply subtracting the output delay of an unloaded test circuit from the output delay of a loaded test circuit, a more accurate determination of the FEOL/BEOL delay contributions requires a more sophisticated approach. Further complicating this determination of delay contributions from specific FEOL or BEOL components (and relatedly, the identification of specific variations in FEOL and/or BEOL parameter values) is the fact that a change in a BEOL parameter value will have different effects on the output delays of loaded and unloaded test circuits. These differing effects are illustrated in FIGS. 4A and 4B.

Figure 4A:
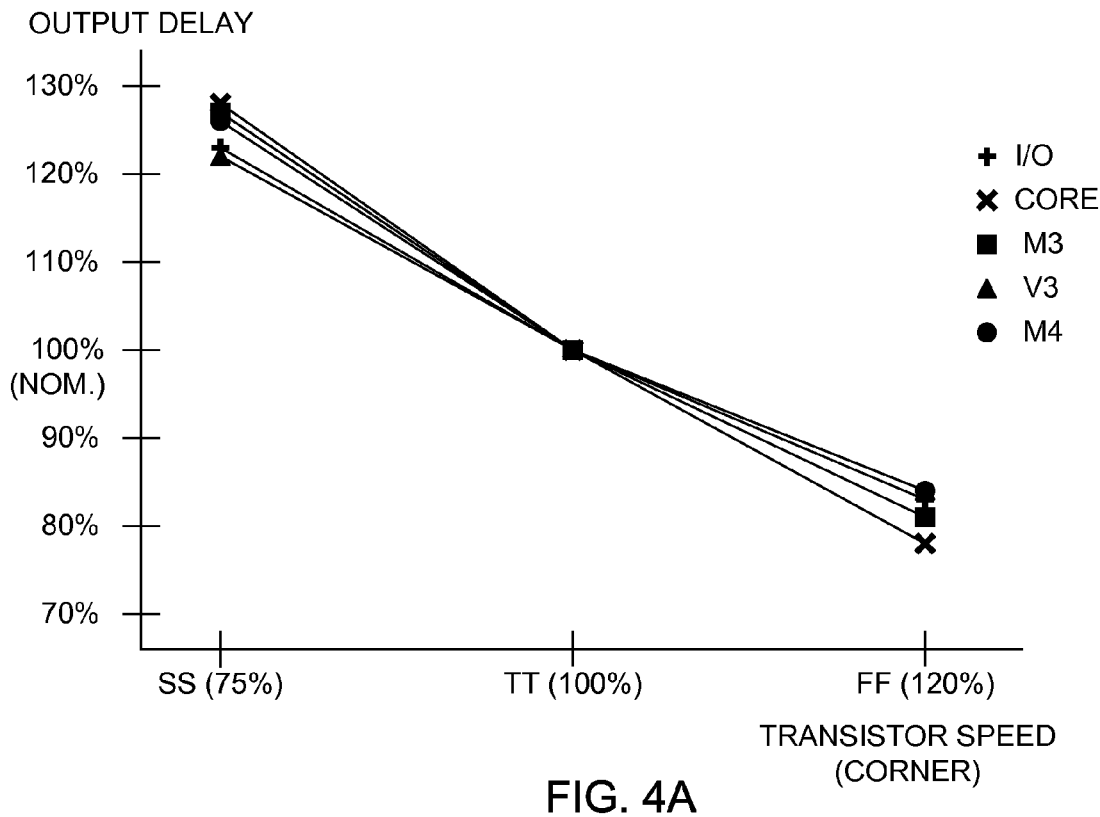
FIGS. 4A and 4B are sample graphs of the relationship between the output delays of the embedded test circuits of the invention and exemplary device-related and interconnect-related parameters, respectively.
Figure 4B:
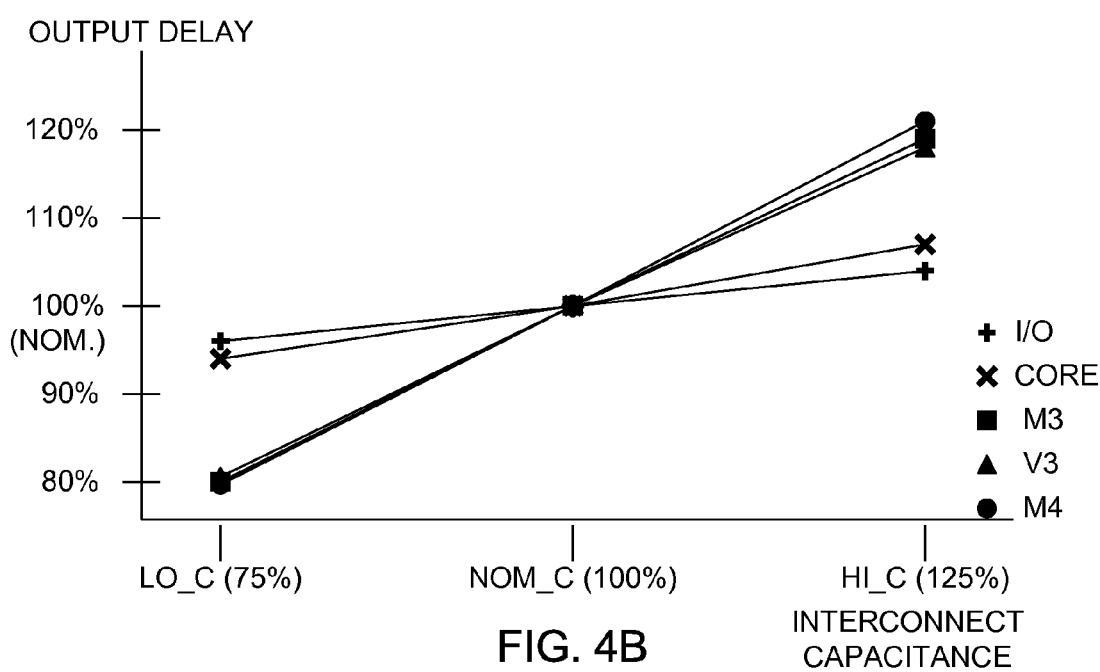

FIGS. 4A and 4B show sample graphs of test circuit outputs (output delays) for embedded test circuits that include various different FEOL and BEOL components. FIG. 4A shows several graphs of embedded test circuit output delay versus transistor speed ("transistor corner") for unloaded test circuits having different types of transistors (I/O transistors and core transistors) and for loaded test circuits having test loads simulating different interconnect layers (metal-3 (M3), via-3 (V3), and metal-4 (M4)).

Output delay in FIG. 4A is graphed at three different transistor speeds: a nominal, or target, speed "TT", a fast speed "FF" that is 20% faster than nominal speed TT, and a slow speed "SS" that is 25% slower than nominal speed TT. Note that as transistor speed increases (from TT to FF), the output delay for each embedded test circuit decreases to about 80% of the nominal output delay value. Similarly, as transistor speed decreases (from TT to SS), the output delay for each embedded test circuit increases to about 125% of the nominal output delay value.

Thus, the data in FIG. 4A indicates that transistor speed variations produce roughly the same change in output delay for all embedded test circuits that incorporate those transistors, regardless of whether those embedded test circuits are loaded or unloaded. Note further that the change in output delay essentially tracks the change in transistor speed (e.g., increase in transistor speed of 20% results in roughly 20% decrease in delay), since transistor speed is generally directly proportional to propagation speed.

However, unlike FEOL parameter variations, changes in BEOL parameter values will typically affect unloaded and loaded test circuits differently. FIG. 4B shows several graphs of embedded test circuit output delay versus interconnect capacitance for unloaded test circuits (formed using I/O transistors or core transistors) and for loaded test circuits (that include test loads simulating different interconnect layers, such as metal-3 (M3), via-3 (V3), and metal-4 (M4)).

Output delay in FIG. 4B is graphed at three different interconnect capacitance values: a nominal, or target value NOM_C, a low capacitance value LO_C that is 25% lower than the target value, and a high capacitance value HI_C that is 25% higher than the target value. The lower the capacitance of an interconnect structure, the faster that signal propagation can take place (i.e., the less signals are delayed by the interconnect structure).

Accordingly, as interconnect capacitance decreases by 25%, the output delays of the embedded test circuits all decrease. However, while the unloaded test circuits (I/O and core transistors) exhibit a roughly 6% decrease in output delay (to 94% of the nominal delay), the loaded test circuits (M3, V3, and M4 interconnects) exhibit a roughly 20% decrease in output delay (to 80% of the nominal delay). Similarly, as interconnect capacitance increases by 25%, the output delays of the embedded test circuits increase by roughly 6% for the unloaded test circuits and by roughly 20% for the loaded test circuits.

Thus, as indicated by the graph of FIG. 4B, the effects of BEOL parameter value variations have a small effect on unloaded test circuit output delay, and a much larger effect on loaded test circuit output delay. Therefore, to obtain a more accurate representation of the performance-related effects of BEOL (and FEOL) components requires that a set of model equations be created and solved.

According to an embodiment of the invention, a model equation corresponds to a particular embedded test circuit, and provides an expected output delay based on delay contributions from both FEOL and BEOL parameters (i.e., FEOL and BEOL characteristics such as transistor speed and interconnect capacitance). The model equation therefore includes at least one FEOL parameter variable modified by a FEOL correction factor and at least one BEOL parameter variable modified by a BEOL correction factor. The FEOL and BEOL correction factors represent the effect of a change in the FEOL or BEOL parameter variable, respectively, on the output of the model equation.

For example, a sample model equation for the output delay $X_{ij}$ of an unloaded test circuit can be given by the following:

$$X_{ij}=(1+C_{FF}*\Delta F_i)*(1+C_{BF}*\Delta B_j) \quad [1]$$

where $\Delta F_i$ is the change in the value of a particular FEOL parameter $F_i$ (e.g., transistor speed), $\Delta B_j$ is the change in the value of a particular BEOL parameter $B_j$ (e.g., interconnect capacitance for M1 interconnects), $C_{FF}$ is an FEOL correction factor representing the effect of variations in FEOL parameter $F_i$ on the output delay of the unloaded test circuit, and $C_{BF}$ is a BEOL correction factor representing the effect of variations in BEOL parameter $B_j$ on the output delay of the unloaded test circuit. Note that while normalized terms (i.e., terms that indicate a deviation from a nominal value, rather than an absolute value) are used for exemplary purposes, the same principles can be applied to absolute terms.

In a similar vein, a sample model equation for the output delay $Y_{ij}$ of a loaded test circuit can be given by the following:

$$Y_{ij}=(1+C_{FB}*\Delta F_i)*(1+C_{BB}*\Delta B_j) \quad [2]$$

where $C_{FB}$ is an FEOL correction factor representing the effect of variations in FEOL parameter $F_i$ on the output delay of the loaded test circuit, and $C_{BB}$ is a BEOL correction factor representing the effect of in parameter $B_j$ on the output delay of the loaded test circuit.

Note that while Equations 1 and 2 both based on a single FEOL parameter (FEOL variable $\Delta F_i$) and a single BEOL parameter (BEOL variable $\Delta B_j$) for exemplary purposes, according to various other embodiments of the invention, a model equation can include terms related to any number of FEOL and BEOL parameters. For example, Equation 1 described above could be replaced with the following:

$$X_{ij}=(1+C_{FF}*\Delta F_i)*(1+C_{BFj}*\Delta B_j)*(1+C_{BFk}*\Delta B_k)* \quad [3]$$

where $\Delta B_j$ and $\Delta B_k$ are the changes in the values of BEOL parameters $B_j$ and $B_k$ (e.g., interconnect capacitance for M1 interconnects and interconnect capacitance for V1 interconnects), respectively, $C_{BFj}$ is a BEOL correction factor representing the effect of variations in BEOL parameter $B_j$ on the output delay of the unloaded test circuit, and $C_{BFk}$ is a BEOL correction factor representing the effect of variations in BEOL parameter $B_k$ on the output delay of the unloaded test circuit.

Note also that according to an embodiment of the invention, each FEOL or BEOL parameter can be associated with a set of FEOL or BEOL correction factors, respectively. For example, the model equation associated with a core transistor-based test circuit could include a different FEOL correction factor for each different type of BEOL parameter (e.g., $C_{FF}(1)$ for the effect of M1 capacitance in an unloaded core transistor test circuit, $C_{FF}(2)$ for the effect of V1 capacitance in an unloaded core transistor test circuit, $C_{FB}(1)$ for the effect of M1 capacitance in a loaded core transistor test circuit, $C_{FB}(2)$ for the effect of V1 capacitance in a loaded core transistor test circuit, etc.). Similarly, the model equation associated with a M1 interconnect-loaded test circuit could include a different BEOL correction factor for each different type of FEOL parameter (e.g., $C_{BF}(1)$ for the effect of M1 capacitance on core transistors in an unloaded test circuit, $C_{BF}(2)$ for the effect of M1 capacitance on I/O transistors in an unloaded test circuit, $C_{BB}(1)$ for the effect of M1 capacitance on core transistors in a loaded test circuit, $C_{BB}(2)$ for the effect of M1 capacitance on I/O transistors in a loaded test circuit, etc.).

However, as indicated by the graph in FIG. 4A, variations in FEOL parameter values tend to have a consistent effect on test circuit output, regardless of the type of interconnect loading included in the test circuit. Therefore, according to an embodiment of the invention, the set of model equations for an IC can be simplified by using a single FEOL correction factor (i.e., $C_{FF}=C_{FB}$). Since transistor speed has a roughly 1:1 relationship with signal propagation delay, if the FEOL parameter is transistor speed, this single FEOL correction factor can be set equal to one (100%), as indicated below:

$$C_{FF}=C_{FB}=1 \quad [4]$$

Likewise, as indicated by the graph in FIG. 4B, variations in BEOL parameters tend to have a consistent effect on loaded test circuits and a consistent effect on unloaded test circuits. Therefore, according to an embodiment of the invention, instead of different BEOL correction factor for every possible FEOL and BEOL parameter combination, the set of model equations for an IC includes only two BEOL correction factors: a first BEOL correction factor representing the effect of changes in a BEOL parameter on the output of an unloaded test circuit, and a second BEOL correction factor representing the effect of changes in the BEOL parameter on the output of a loaded test circuit.

For example, as indicated in the graph of FIG. 4B, increasing or decreasing interconnect capacitance by 25% increases or decreases, respectively, all unloaded test circuit (FEOL) output delays by roughly 6%, and increases or decreases, respectively, all loaded test circuit (BEOL) output delays by roughly 20%. Therefore, BEOL correction factor $C_{BF}$ (i.e., the effect of BEOL parameter variations on unloaded test circuit output) can be determined by normalizing the FEOL output delay by the change in capacitance, as shown below:

$$C_{BF}=6\%/25\%=24\%(0.24) \qquad [5]$$

Similarly, BEOL correction $C_{BB}$ (i.e., the effect of BEOL parameter variations on loaded test circuit output) can be determined by normalizing the BEOL output delay by the change in capacitance, as shown below:

$$C_{BB}=20\%/25\%=80\%(0.80) \qquad [6]$$

These values of BEOL correction factors $C_{BF}$ and $C_{BB}$ can then be substituted in to all unloaded and loaded model equations, respectively. For example, substituting Equations 4 and 5 into Equation 1 yields:

$$X_{ij}=(1+\Delta F_i)*(1+0.24*\Delta B_j) \qquad [7]$$

Similarly, substituting Equations 4 and 6 into Equation 2 yields:

$$Y_{ij}=(1+\Delta F_i)*(1+0.80*\Delta B_j) \qquad [8]$$

In this manner, model equations can be defined for all combinations of FEOL and BEOL parameter variables.

Once the model equations have been defined (e.g., Equations 7 and 8), they can be solved for the parameter variables, thereby generating a set of parameter equations (i.e., an equation for a particular FEOL or BEOL parameter) that are all functions of output delays (e.g., $X_{ij}$ and $Y_{ij}$). The actual (measured) output delays can then be substituted into the parameter equations to generate parameter values for the various FEOL and BEOL components, thereby allowing any problematic deviations to be directly detected.

For example, model Equations 7 and 8 can be solved for parameter variables $\Delta F_i$ and $\Delta B_j$ as follows. First, solving Equation 7 for $\Delta F_i$ yields:

$$\Delta F_i=X_{ij}/(1+0.24*\Delta B_j)-1 \qquad [9]$$

Similarly, solving Equation 8 for $\Delta F_i$ yields:

$$\Delta F_i=Y_{ij}/(1+0.80*\Delta B_j)-1 \qquad [10]$$

Equation 9 can then be substituted into Equation 10 to yield:

$$X_{ij}/(1+0.24*\Delta B_j)-1=Y_{ij}/(1+0.80*\Delta B_j)-1 \qquad [11]$$

which can then be solved for BEOL variable $\Delta B_j$ as indicated below:

$$\Delta B_j=(Y_{ij}-X_{ij})/(0.80*X_{ij}-0.24*Y_{ij}) \qquad [12]$$

In this manner, a parameter equation for $\Delta B_j$ as a function of output delays $X_{ij}$ and $Y_{ij}$ can be derived. Equation 12 can then be substituted into Equation 9 to generate a parameter equation for $\Delta F_i$ as a function of output delays $X_{ij}$ and $Y_{ij}$, as indicated below:

$$\Delta F_i = \left[ \frac{X_{ij}}{1 + \frac{0.24*(Y_{ij}-X_{ij})}{0.80*X_{ij}-0.24*Y_{ij}}} \right] - 1 \qquad [13]$$

Measured values for output delays $X_{ij}$ and $Y_{ij}$ from the appropriate unloaded and loaded embedded test circuits, respectively, can then be substituted in to parameter equations 12 and 13 to provide values for BEOL parameter $\Delta B_j$ and FEOL parameter $\Delta F_i$, respectively. In this manner, the BEOL delay contributions to the FEOL test circuit measurements can be eliminated, and vice versa. Therefore, the source of any performance-affecting problems in an IC can be quickly isolated down to the particular FEOL and/or BEOL parameter(s).

Figure 5A:
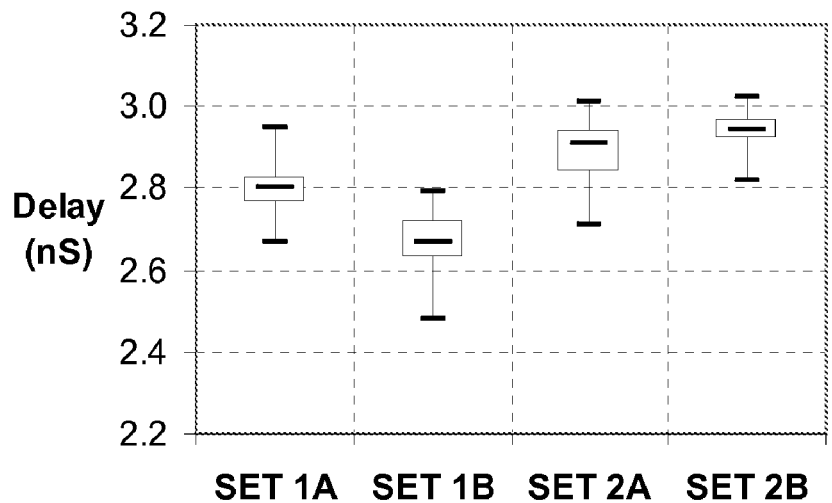
FIGS. 5A-5B are charts of experimental data that depict combined and FEOL-only delay effects.

FIGS. 5A-5B and FIGS. 6A-6B are graphs of experimental data that indicate the applicability of model Equations 12 and 13. FIG. 5A shows a graph of four sets of experimental data, set 1A, 1B, 2A, and 2B. Data sets 1A and 1B include output delay measurements from a first group of unloaded (FEOL) test circuits, while data sets 2A and 2B include output delay measurements from a second group of unloaded test circuits. For testing purposes, the second group of unloaded test circuits was designed and processed to have a higher metal-1 layer capacitance than the first group of unloaded test circuits. Thus, for the reasons described above, the output delay values associated with the second group of unloaded test circuits (i.e., data sets 2A and 2B) are greater than the output delay values associated with the first group of unloaded test circuits (i.e., data sets 1A and 1B).

Figure 5B:
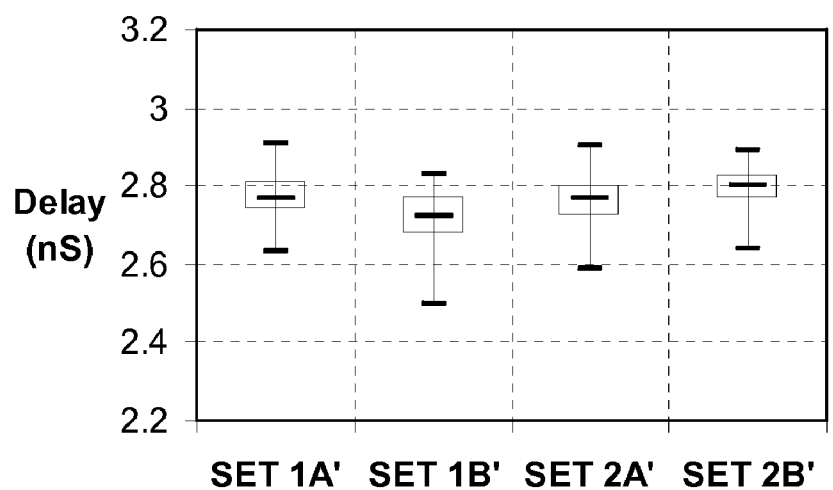

FIG. 5B shows a graph of the experimental data from FIG. 5A, after the metal-1 layer (BEOL) capacitance delay contributions have been removed from the output delay measurements, using Equation 13. Data sets 1A, 1B, 2A, and 2B are converted in this manner into "FEOL-only" data sets 1A', 1B', 2A', and 2B', respectively. The high degree of correlation between data sets 1A', 1B', 2A', and 2B' indicates that Equation 13 provides effective removal of the BEOL delay contributions. Note that the remaining variations among data sets 1A', 1B', 2A', and 2B' are due to transistor process variations.

Figure 6A:
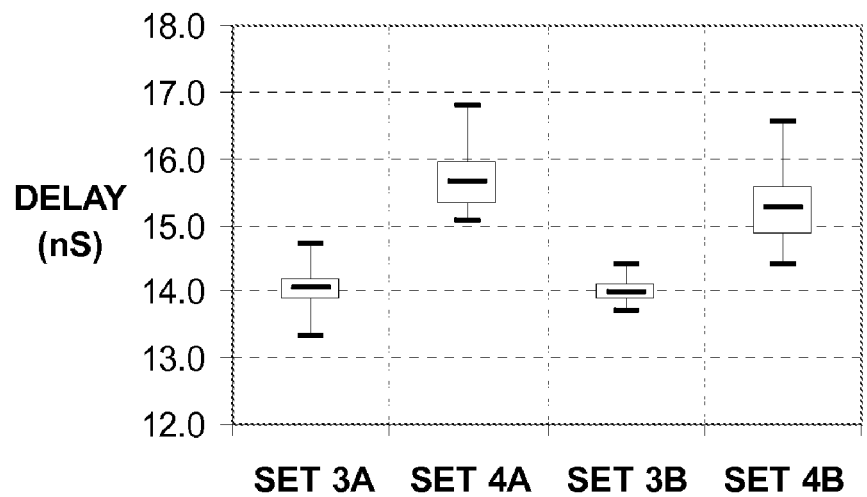
FIGS. 6A-6B are charts of experimental data that depict combined and BEOL-only delay effects.

Similarly, FIG. 6A shows a graph of four new sets of experimental data, sets 3A, 3B, 4A, and 4B. Data sets 3A and 3B include output delay measurements from a first group of loaded test circuits, while data sets 4A and 4B include output delay measurements from a second group of loaded test circuits. For testing purposes, the second group of loaded test circuits was designed and processed to include transistors having higher threshold voltages (Vtsat) than the transistors in the first group of loaded test circuits. Thus, for the reasons described above, the output delay values associated with the second group of loaded test circuits (i.e., data sets 4A and 4B) are higher than the output delay values associated with the first group of loaded test circuits (i.e., data sets 3A and 3B).

Figure 6B:
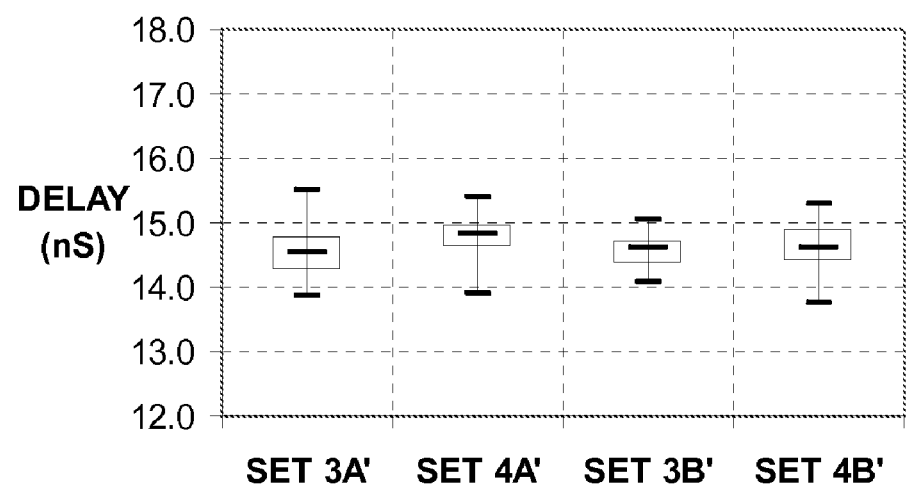

FIG. 6B shows a graph of the experimental data from FIG. 6A, after the transistor-related (FEOL) delay contributions have been removed from the output delay values, using Equation 12. Data sets 3A, 4A, 3B, and 4B are converted in this manner to "BEOL-only" data sets 3A', 4A', 3B', and 4B', respectively. The high degree of correlation between data sets 3A', 4A', 3B', and 4B' indicates the Equation 12 provides effective removal of the FEOL delay contributions. Note that the remaining variations among data sets 3A', 4A', 3B', and 4B' are due to metal-1 process variations.

Figure 7:
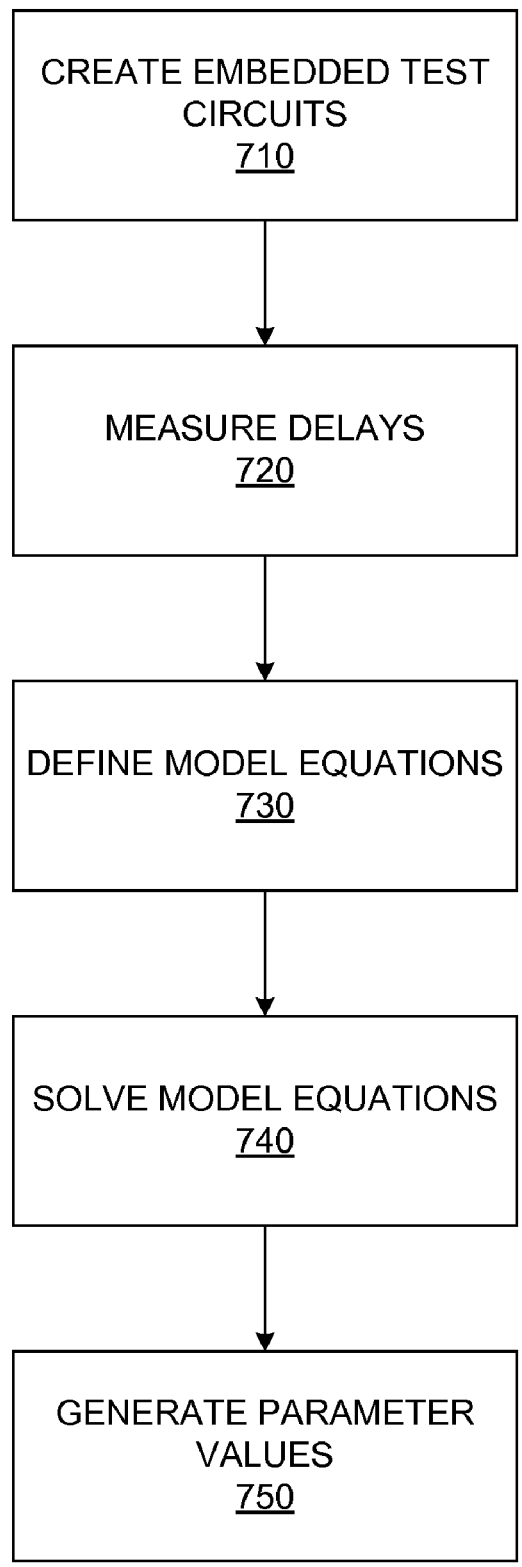
FIG. 7 is a flow diagram of a method for analyzing IC performance, according to an embodiment of the invention.

FIG. 7 shows a flow diagram of a performance analysis methodology in accordance with an embodiment of the invention. In a "CREATE EMBEDDED TEST CIRCUITS" step 710, a wafer is processed to include multiple embedded test circuits in each IC, wherein each embedded test circuit includes a ring oscillator and test load, as described above with respect to FIG. 3. Then, in a "MEASURE DELAYS" step 720, the output delays from each embedded test circuit is measured. Note that according to various embodiments of the invention, this testing can be performed before or after the wafer is diced into individual IC chips. Note that according to another embodiment of the invention, the ICs formed on the wafer can comprise programmable logic ICs (e.g., FPGAs) that are configured into measurement circuits to read the output delays of the embedded test circuits.

In a "DEFINE MODEL EQUATIONS" step 730, a model equation is defined for each embedded test circuit in an IC, wherein each model equation is a function of at least one FEOL parameter and one BEOL parameter of the IC. Then, in a "SOLVE MODEL EQUATIONS" step 740, the model equations are solved for the FEOL and BEOL parameters to generate a set of parameter equations that are functions of the output delays of the embedded test circuits. Note that according to various embodiments of the invention, steps 730 and 740 can be performed before, after, or concurrently with steps 710 and 720.

Finally, in a "GENERATE PARAMETER VALUES" step 750, the output delays measured in step 720 are substituted into the parameter equations created in step 740 to determine actual values for the FEOL and BEOL parameters of interest. Any deviation from expected parameter values can be indicative of a process or design problem that may provide performance enhancement if corrected.

The various embodiments of the structures and methods of this invention that are described above are illustrative only of the principles of this invention and are not intended to limit the scope of the invention to the particular embodiments described. Thus, the invention is limited only by the following claims and their equivalents.

What is claimed is:

1. A method for analyzing an integrated circuit (IC), the method comprising:

creating a first embedded test circuit in the IC for generating a first output delay, the first embedded test circuit comprising a first ring oscillator coupled to a first test load, the first test load being formed in a first interconnect layer of the IC;

creating a second embedded test circuit in the IC for generating a second output delay, the second embedded test circuit comprising a second ring oscillator, the second ring oscillator being an unloaded ring oscillator, the second ring oscillator being substantially similar to the first ring oscillator;

providing a first parameter equation and a second parameter equation, the first parameter equation and the second parameter equations specifying a first Front End Of the Line (FEOL) parameter and a first Back End Of the Line (BEOL) parameter, respectively, as functions of the first output delay and the second output delay;

measuring a first measured output delay and a second measured output delay from the first embedded test circuit and the second embedded test circuit, respectively;

substituting the first measured output delay and the second measured output delay into the first parameter equation to generate a first FEOL parameter value; and substituting the first measured output delay and the second measured output delay into the second parameter equation to generate a first BEOL parameter value.

2. The method of claim 1, further comprising:

creating a third embedded test circuit in the IC for generating a third output delay, the third embedded test circuit comprising a third ring oscillator coupled to a second test load, the second test load being formed in a second interconnect layer of the IC, the third ring oscillator being substantially similar to the first ring oscillator;

providing a third parameter equation, the third parameter equation specifying a second BEOL parameter as a function of the second output delay and the third output delay;

measuring a third measured output delay from the third embedded test circuit; and substituting the third measured output delay into the third parameter equation to generate a second BEOL parameter value.

3. The method of claim 1, wherein providing the first parameter equation and the second parameter equation comprises:

providing a first model equation for the first embedded test circuit, the first model equation specifying the first output delay as a function of the first FEOL parameter and the first BEOL parameter;

providing a second model equation for the second embedded test circuit, the second model equation specifying the second output delay as a function of the first FEOL parameter and the first BEOL parameter;

solving the first model equation and the second model equation for the first FEOL parameter to generate the first parameter equation; and solving the first model equation and the second model equation for the first BEOL parameter to generate the second parameter equation.

4. The method of claim 3, wherein providing the first parameter equation and the second parameter equation further comprises defining a first FEOL correction factor, a second FEOL correction factor, a first BEOL correction factor, and a second BEOL correction factor, wherein the first model equation comprises a first FEOL parameter variable multiplied by the first FEOL correction factor and a first BEOL parameter variable multiplied by the first BEOL correction factor, and wherein the second model equation comprises the first FEOL parameter variable multiplied by the second FEOL correction factor and the first BEOL parameter variable multiplied by the second BEOL correction factor.

5. The method of claim 4 wherein the first model equation is given by:

$$D1=(1FCF1*FP1)*(1+BCF1*BP1)$$

where D1 is the first output delay, FCF1 is the first FEOL correction factor, FP1 is the first FEOL parameter variable, BCF1 is the first BEOL correction factor, and BP1 is the first BEOL parameter variable, and wherein the second model equation is given by:

$$D2=(1+FCF2*FP1)*(1+BCF2*BP1)$$

where D2 is the second output delay, FCF2 is the second FEOL correction factor, and BCF2 is the second BEOL correction factor.

6. The method of claim 5 wherein the first FEOL parameter is transistor speed, and wherein the first FEOL correction factor and the second FEOL correction factor are both equal to one.

7. The method of claim 1, wherein the IC comprises a field programmable gate array (FPGA), and wherein measuring the first measured output delay and the second measured output delay comprises:
 configuring the FPGA as a measurement circuit;
 reading the first measured output delay from the first embedded test circuit using the measurement circuit; and
 reading the second measured output delay from the second embedded test circuit using the measurement circuit.

8. A system for analyzing an integrated circuit (IC) comprising:
 means for measuring a first delay value from a first embedded test circuit in the IC, the first embedded test circuit comprising a first ring oscillator coupled to a first test load, the first test load representing an interconnect path in the IC;
 means for measuring a second delay value from a second embedded test circuit in the IC, wherein the second embedded test circuit is an unloaded test circuit, the second embedded test circuit comprising a second ring oscillator; and
 means for comparing the first delay value to the second delay value.

9. The system of claim 8 wherein the IC comprises an FPGA.

* * * * *